United States Patent [19]
Yasuda

[11] Patent Number: 5,382,847
[45] Date of Patent: Jan. 17, 1995

[54] OUTPUT BUFFER CIRCUITS INCLUDING VOLTAGE COMPENSATION

[75] Inventor: Kenichi Yasuda, Hyogo, Japan

[73] Assignee: Mitsubishi Denki Kabushiki Kaisha, Tokyo, Japan

[21] Appl. No.: 22,647

[22] Filed: Feb. 25, 1993

[30] Foreign Application Priority Data

Feb. 27, 1992 [JP] Japan .................. 4-041042

[51] Int. Cl.⁶ ............... H03K 19/0175; H03K 19/003
[52] U.S. Cl. ........................................ 326/68; 326/21
[58] Field of Search ................. 307/475, 443, 451

[56] References Cited

U.S. PATENT DOCUMENTS

| | | | |
|---|---|---|---|
| 4,408,135 | 10/1983 | Yuyama et al. | 307/451 |
| 4,680,487 | 7/1987 | Kobayashi | 307/451 |
| 4,758,743 | 7/1988 | Dehganpour et al. | 307/451 |
| 4,785,203 | 11/1988 | Nakamura | 307/451 |
| 4,825,101 | 4/1989 | Walters, Jr. | 307/451 |
| 4,829,199 | 5/1989 | Prater | 307/451 |
| 4,855,623 | 8/1989 | Flaherty | 307/451 |
| 4,961,010 | 10/1990 | Davis . | |
| 5,003,205 | 3/1991 | Kohda et al. | 307/451 |
| 5,036,222 | 7/1991 | Davis | 307/451 |
| 5,081,374 | 1/1992 | Davis | 307/270 |
| 5,192,879 | 3/1993 | Aoki et al. | 307/451 |

FOREIGN PATENT DOCUMENTS

0466238A2 1/1992 European Pat. Off. .
62-159911 7/1987 Japan .

Primary Examiner—David R. Hudspeth
Assistant Examiner—Richard Roseen
Attorney, Agent, or Firm—Lowe, Price, LeBlanc & Becker

[57] ABSTRACT

Disclosed is an output buffer circuit for allowing a reduction in overshoot and undershoot without a decrease in output speed of an output signal. This output buffer circuit includes a PMOS transistor and an NMOS transistor complementarily connected to each other, an impedance increasing circuit connected in parallel to PMOS transistor, and an impedance increasing circuit connected in parallel to NMOS transistor. Impedance increasing circuit increases output impedance in accordance with an increase in voltage on an output node of a CMOS circuit. Impedance increasing circuit increases output impedance in accordance with a decrease in voltage on output node of the CMOS circuit.

17 Claims, 17 Drawing Sheets

OUTPUT BUFFER CIRCUITS INCLUDING VOLTAGE COMPENSATION

BACKGROUND OF THE INVENTION

1. Field of the Invention

The present invention relates generally to output buffer circuits in semiconductor integrated circuit apparatus and, more particularly, to a reduction of an overshoot and undershoot of an output signal.

2. Description of the Background Art

A semiconductor integrated circuit apparatus in general includes an output buffer circuit. This output buffer circuit amplifies an internally generated weak signal to a predetermined level and drives externally connected load.

FIG. 14 is a block diagram showing such a semiconductor integrated circuit device. Referring to FIG. 14, the semiconductor integrated circuit device 20 includes supply terminals Vcc and Vss, a plurality of signal input terminals Si, a plurality of data output terminals DO and a semiconductor chip 21. The semiconductor chip 21 includes an output buffer circuit 22 each formed a CMOS inverter, and a data generator 23 responsive to a signal input to the signal input terminals SI for outputting data Din and an output enable signal OE. The semiconductor chip 21 is connected to respective external terminals SI, DO, Vcc and Vss by means of bonding pads 24 and bonding wires 3.

The output buffer circuit includes an input terminal Din for receiving an input signal, an output enable signal input terminal OE for receiving an output enable signal, an output terminal Dout for outputting an output signal, a power supply terminal Vcc set in a driving potential, a ground terminal GND set in a ground potential, a P channel transistor 1, an N channel transistor 2, a NOR gate 4, a NAND gate 5 and inverters 6, 7 and 8.

Input terminal Din is connected to one input terminal of NOR gate 4 and one input terminal of NAND gate 5. Output enable signal input terminal OE is connected to the other input terminal of NAND gate 5 and to the other input terminal of NOR gate 4 via inverter 6. An output terminal of NOR gate 4 is connected via inverter 7 to a gate electrode of P channel transistor 1. An output terminal of NAND gate 5 is connected via inverter 8 to a gate electrode of N channel transistor 2. P channel transistor 1 has its source electrode connected to power supply terminal Vcc and its drain electrode to a node N3. N channel transistor 1 has its source electrode connected to ground terminal GND and its drain electrode to node N3. Node N3 is connected through a bonding wire 3 to output terminal Dout. A node N1 is connected to the gate electrode of P channel transistor 1, a node N2 is connected to the gate electrode of N channel transistor 2, and a reference character "L" indicates inductance included in bonding wire 3 or the like.

In the following description, reference characters of an input signal, an output signal, an output enable signal, a supply voltage and a ground potential are provided to match those of corresponding terminals employing those corresponding signals, supply voltage and ground potential.

An operation of the output buffer device shown in FIG. 14 will now be described.

Output enable signal OE is a signal which activates the output buffer device when attaining a logic high level (hereinafter referred to as an H level) and inactivates the output buffer device when attaining a logic low level (hereinafter referred to as an L level).

When output enable signal OE is at an L level, output node N1 of inverter 7 and output node N2 of inverter 8 are at an H level and an L level, both P channel transistor 1 and N channel transistor 2 turn off, and output terminal Dout is put in a high impedance state.

If input signal Din of an H level is applied when output enable signal OE is at an H level, then an output of NOR gate 4 attains an L level, and an output of NAND gate 5 attains an L level. The output of NOR gate 4 is inverted by inverter 7, while the output of NAND gate 5 is inverted by inverter 8. Accordingly, respective output signals of respective nodes N1 and N2 attain an H level, so that N channel transistor 2 turns on and a signal of an L level is output to output terminal Dout. Similarly, when output enable signal OE and input signal Din are at an H level and an L level, respectively, both nodes N1 and N2 attain an L level, so that P channel transistor 1 turns on and an output signal of an H level is output to output terminal Dout.

In an actual semiconductor integrated circuit apparatus, there exists inductance L generated by bonding wire 3 or the like between node N3 connected in common to P channel transistor 1 and N channel transistor 2 and output Dout. Because of this inductance L, a current keeps flowing even after output signal Dout attains the ground potential or supply potential Vcc, resulting in generation of an overshoot and undershoot of the output signal.

A description will now be made on the generation of the overshoot and undershoot due to inductance L with reference to a waveform diagram of FIG. 15 and 16.

FIG. 15 (1) shows waveforms of the voltage at node N1, the voltage at the output terminal Dout and of the current flowing through the inductance L at the time of generation of an overshoot in the output buffer circuit shown in FIG. 14. FIG. 15 (2) shows energy stored in the inductance L.

FIG. 16 is a waveform diagram of simulation of input signal Din, voltages on nodes N1–N3 and output signal Dout when the output buffer device shown in FIG. 14 is rendered active. Referring to FIGS. 15 and 16, VN1 denotes a voltage waveform of node N1, VN2 denotes a voltage waveform of node N2, and VN3 denotes a voltage waveform of node N3.

An overshoot is generated in the following manner. With the logic level of input signal Din changing from an H level to an L level, the logic level of respective voltages on nodes N1 and N2 changes from an H level to an L level. P channel transistor 1 turns on from an OFF state in response to voltage VN1 on node N1, while N channel transistor 2 turns off from an ON state in response to voltage VN2 on node N2. With the transistors turning on/off, voltage VN3 on node N3 increases abruptly and a current I abruptly flows through bonding wire 3 as shown in FIG. 15 (1), so that energy is stored in inductance L as shown in FIG. 15 (2). This energy is in proportion to Ldi/dt wherein I is a current flowing through inductance L, and L is a constant of the inductance. This energy causes a current to flow even after output terminal Dout attains supply potential Vcc, whereby the overshoot is generated in the end of rising of output signal Dout.

The generation of an undershoot will now be described. With the logic level of input signal Din changing from an L level to an H level, the logic level of respective voltages VN1 and VN2 on respective nodes N1 and N2 changes from an L level to an H level. P channel transistor 1 turns off in response to the level change of voltages VN1 and VN2, so that N channel transistor 2 turns on. Consequently, voltage VN3 on node N3 falls abruptly. At this voltage fall, energy in proportion to Ldi/dt is stored in inductance L, and the stored energy still flows even after output signal Dout attains the ground potential. This results in the generation of the undershoot shown in FIG. 16.

The conventional CMOS type output buffer device in common use has a possibility that the above-described overshoot and undershoot are generated and that the overshoot and undershoot cause a spurious emission noise.

It is necessary to decrease the stored energy (Ldi/dt) in order to reduce the overshoot and undershoot; however, inductance L cannot be decreased because inductance L is attributed to bonding wire 3 or the like. Accordingly, a method of decreasing di/dt, i.e., a gradient of a current is considered. To implement this method, two methods are applied: the one is diminishing the rising or falling of voltages VN1 and VN2 on nodes N1 and N2, and the other is reducing the size of P channel transistor 1 and N channel transistor 2 and decreasing an output current to output node N3.

However, since both methods have such approach as to decrease the gradient of a current between ground potential GND and supply potential Vcc, those methods have a disadvantage that it takes longer time that output signal Dout attains supply potential Vcc or ground potential GND, and output speed is decreased.

SUMMARY OF THE INVENTION

One object of the present invention is to reduce an undershoot and overshoot of an output signal without a decrease in output speed in an output buffer circuit.

Another object of the present invention is to reduce a change in current with respect to a change in time in the end of rising or falling of an output signal in an output buffer circuit.

Briefly, an output buffer circuit according to the present invention includes an output terminal for outputting data, an input terminal for receiving a binary logic signal, first and second power supply terminals set at high and low potentials. This output buffer circuit further includes a first switching element, a second switching element, switching control circuit and compensating circuit. The first switching element is connected between the output terminal and the first power supply terminal. The second switching element is connected between the output terminal and the second power supply terminal. The switching control circuit turns on and off the first and second switching elements in a complementary manner in response to the binary logic signal. The compensating circuit temporarily increases output impedance to the output terminal upon a change in level of the binary logic signal in response the voltage at the output terminal, whereby effect of inherent inductance at the output terminal is mitigated.

In operation, in the output buffer circuit according to the present invention, since the compensating circuit temporarily increases output impedance in accordance with the level of the output terminal, a current flowing into the output terminal decreases as the level of an output signal increases.

The overshoot and the undershoot are thus reduced. In addition, since the highest impedance is provided in proximity to the end of the level change of the output signal, a decrease in output speed can be prevented. Moreover, since the highest impedance is provided immediately before the end of the level change of the output signal, a decrease in speed of output signal can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described in detail with reference to the drawings.

Figure 1:
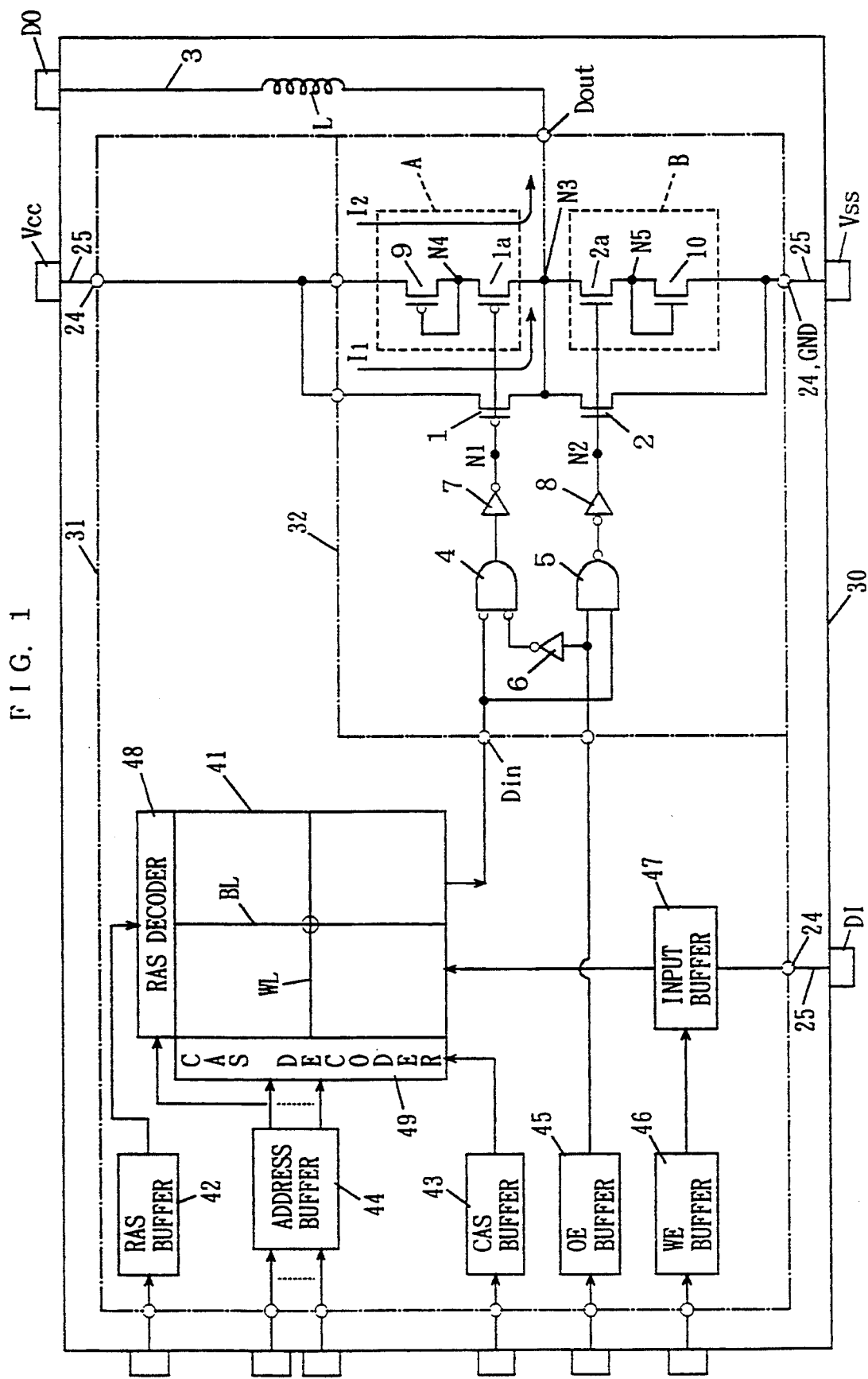
FIG. 1 is a block diagram showing one embodiment of a dynamic random access memory device having an output buffer device of the present invention.

FIG. 1 is a block diagram showing structure of a dynamic random access memory device having an output buffer device according to one embodiment of the present invention.

Referring to FIG. 1, the DRAM device 30 includes a semiconductor chip 31, a supply terminal Vcc, a ground terminal Vss, an output data input terminal DI and an output data output terminal DO, which are connected to the semiconductor chip 31 by means of bonding wires 25. The semiconductor chip 31 includes an output buffer circuit 32, a memory cell array 41 including a plurality of memory cells in rows and columns, an RAS buffer 42, a CAS buffer 43, an address buffer 44, a WE buffer 45, an OE buffer 46, an input buffer 47, a row decoder 48 and a column decoder 49.

RAS buffer 42 latches a row address strobe signal and applies the same to row decoder 48. CAS buffer 43 latches a column address strobe signal and applies the same to column decoder 49. Address buffer 44 latches an external address signal and applies the same to row decoder 48 and column decoder 49. Row decoder 48 selects a word line WL in the row direction in response to the row address signal, while column decoder 49 selects one bit line BL in the column direction in response to the column address signal. By such selecting operation, a memory cell in memory cell array 41 is activated. WE buffer 45 latches a data write enable signal and applies the same to input buffer 47. Input buffer 47 amplifies the input data DI and applies the same to the activated memory cell. DE buffer circuit 45 latches an output enable signal OE and applies the same to output buffer circuit 32. Output buffer circuit 32 amplifies data from the activated memory cell and applies the same to external output terminal DO.

Figure 14:
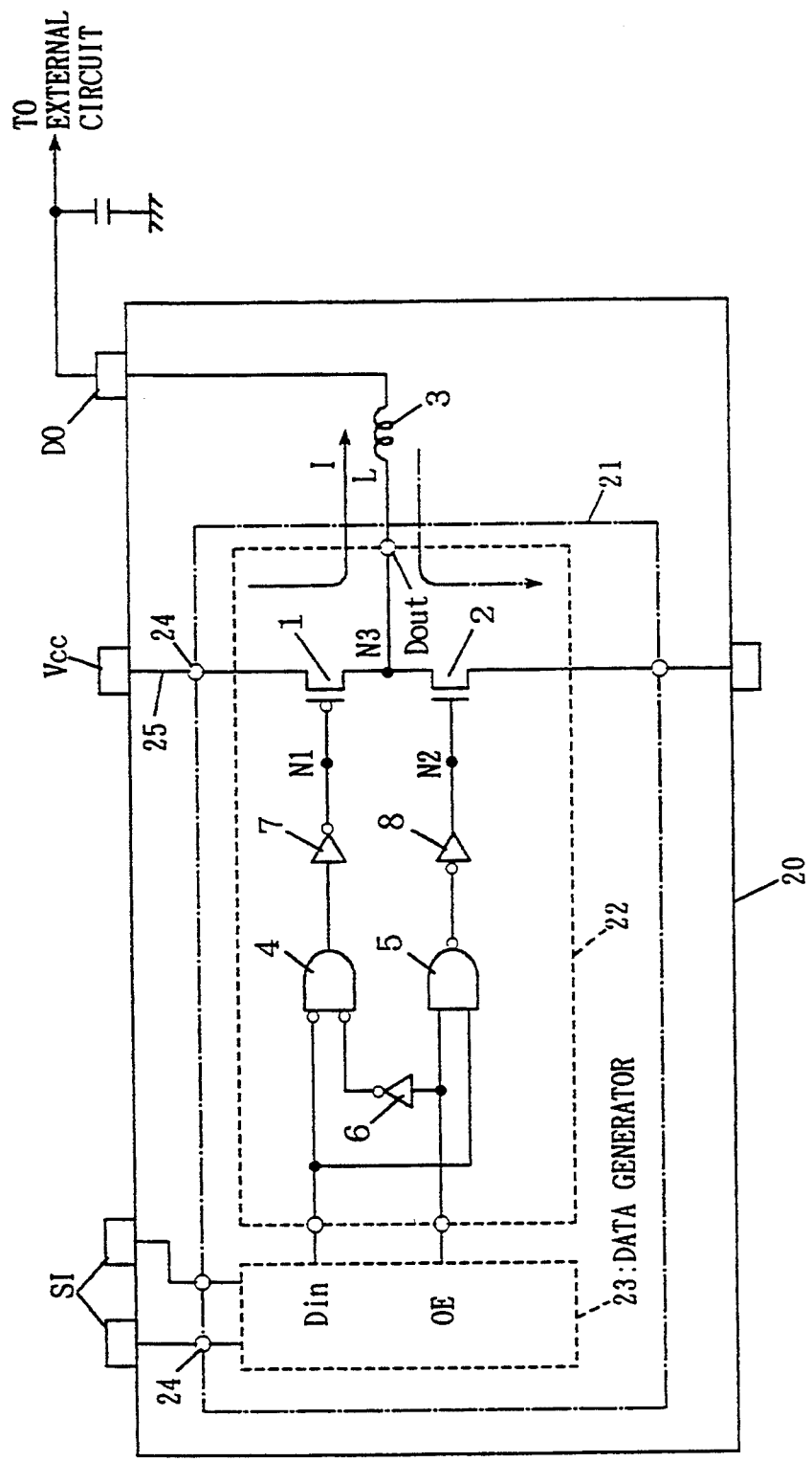
FIG. 14 is a block diagram of a semiconductor integrated circuit device including a conventional output buffer circuit.
Figure 15:
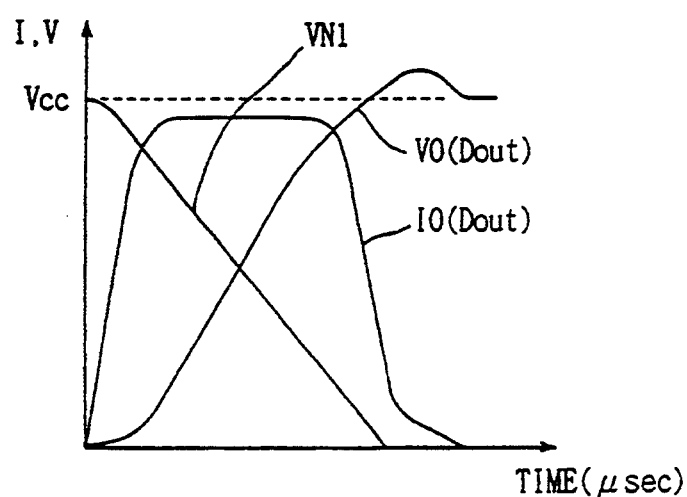
FIGS. 15(1) and 15(2) are diagrams of waveforms of various circuits at the time of generation of overshoot in the output buffer circuit shown in FIG. 14.
Figure 15:
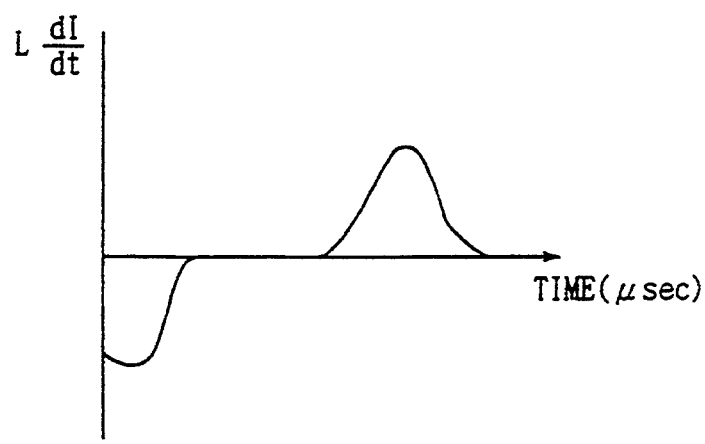

The output buffer device 32 of FIG. 1 is different from that of FIG. 14 in that a first output impedance increasing circuit A for increasing output impedance in accordance with a decrease in voltage on a node N3 is provided between node N3 and a power supply terminal Vcc and that a second output impedance increasing circuit B for increasing output impedance in accordance with a decrease in voltage on node N3 is provided between output node N3 and a ground terminal GND. Since the other circuits in the output buffer circuit are identical to those shown in FIG. 14, identical characters devote those circuits and a description thereof will not be repeated here.

First output impedance increasing circuit A includes a P channel transistor 1a and a P channel transistor 9. Second output impedance increasing circuit B includes an N channel transistor 2a and an N channel transistor 10. P channel transistor 1a has its drain electrode connected to output node N3, its source electrode to a node N4 and its gate electrode to a node N1. P channel transistor 9 has its source electrode connected to power supply terminal Vcc and its drain electrode and its gate electrode connected in common to node N4. N channel transistor 2a has its drain electrode connected to node N3, its source electrode to a node N5 and its gate electrode to node N1. N channel transistor 10 has its source electrode connected to a ground terminal GND and its drain electrode and its gate electrode connected in common to node N5.

Figure 2:
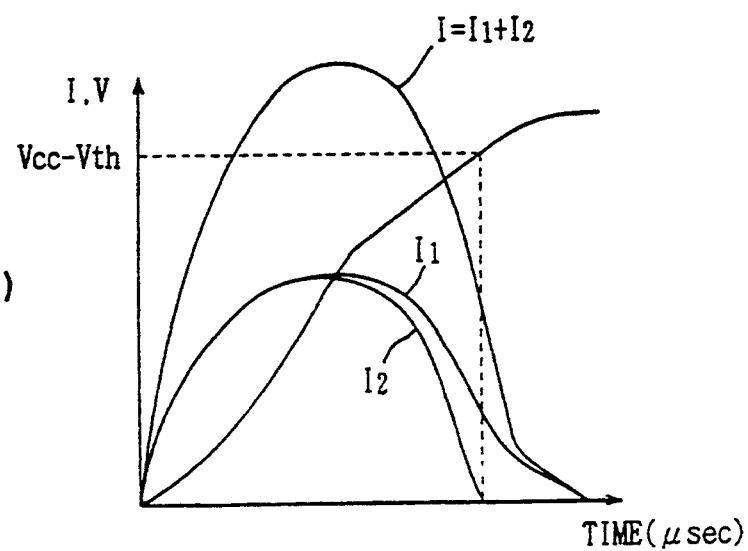
FIGS. 2(1) and 2(2) are diagrams of waveforms at various circuits at the time of overshoot in the output buffer circuit shown in FIG. 1.
Figure 2:
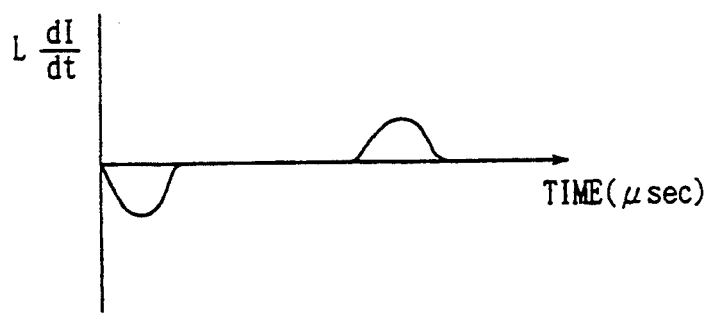

FIG. 2 (1) shows waveforms of the voltage Vo at the output terminal Dout, the current I flowing through the inductance L, the current $I_1$ flowing through a P channel transistor 1 and a current $I_2$ flowing through a first output impedance increasing circuit A at the time of overshoot generation in the output buffer circuit shown in FIG. 1. FIG. 2 (2) shows energy amount stored in the inductance L.

Referring to FIG. 2, at the start of a high level output, p channel transistors 1a and 9 are turned on, and the output current I becomes the sum of the currents $I_1$ and $I_2$. Accordingly, the speed of supply of the charges to the load is increased. However, when the voltage at the node N4 of the impedance increasing circuit A attains Vcc-Vth (vth: threshold voltage of p channel transistor 9), the p channel transistor 9 is turned off. More specifically, impedance increasing circuit A is turned off earlier than p channel transistor 1, and the impedance between the output terminal Dout and the supply terminal Vcc is increased. Consequently, the speed of change of current I can be decreased, suppressing generation of overshoot.

Figure 3:
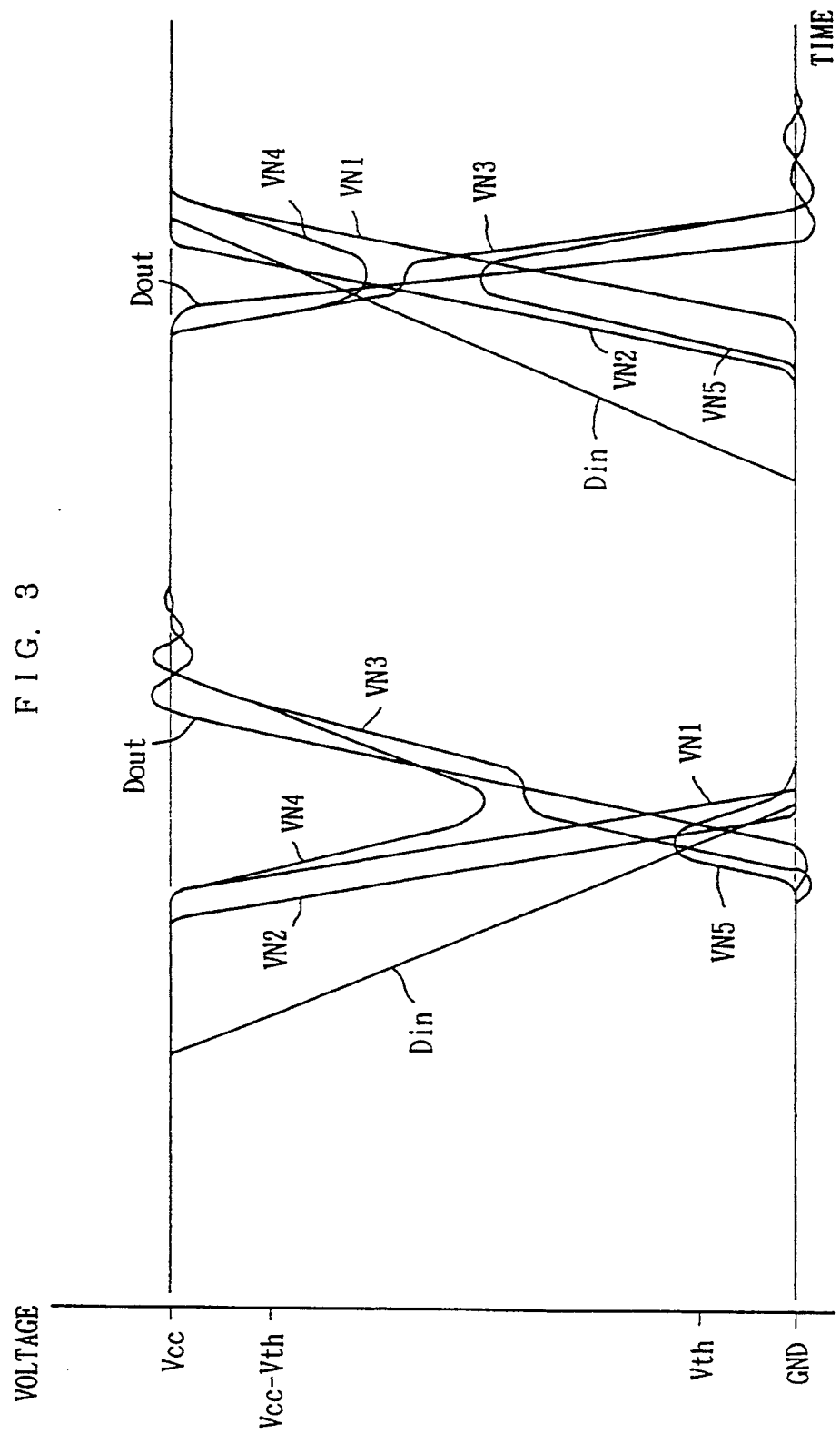
FIG. 3 is a signal waveform diagram of 1 cycle of each circuit in the output buffer device of FIG. 1.

FIG. 3 is a waveform diagram of 1 cycle of nodes N1 to N5, an input signal Din and an output signal Dout when the output buffer device is active.

With reference to FIG. 3, voltage waveforms of nodes N4 and N5 are denoted with VN4 and VN5, respectively.

An operation of the output buffer device shown in FIG. 1 will now be described with reference to the waveform diagram of FIG. 3.

When an output enable signal OE is at an L level, the output buffer device is inactive as in FIG. 14, and output terminal Dout is in a high impedance state.

Figure 16:
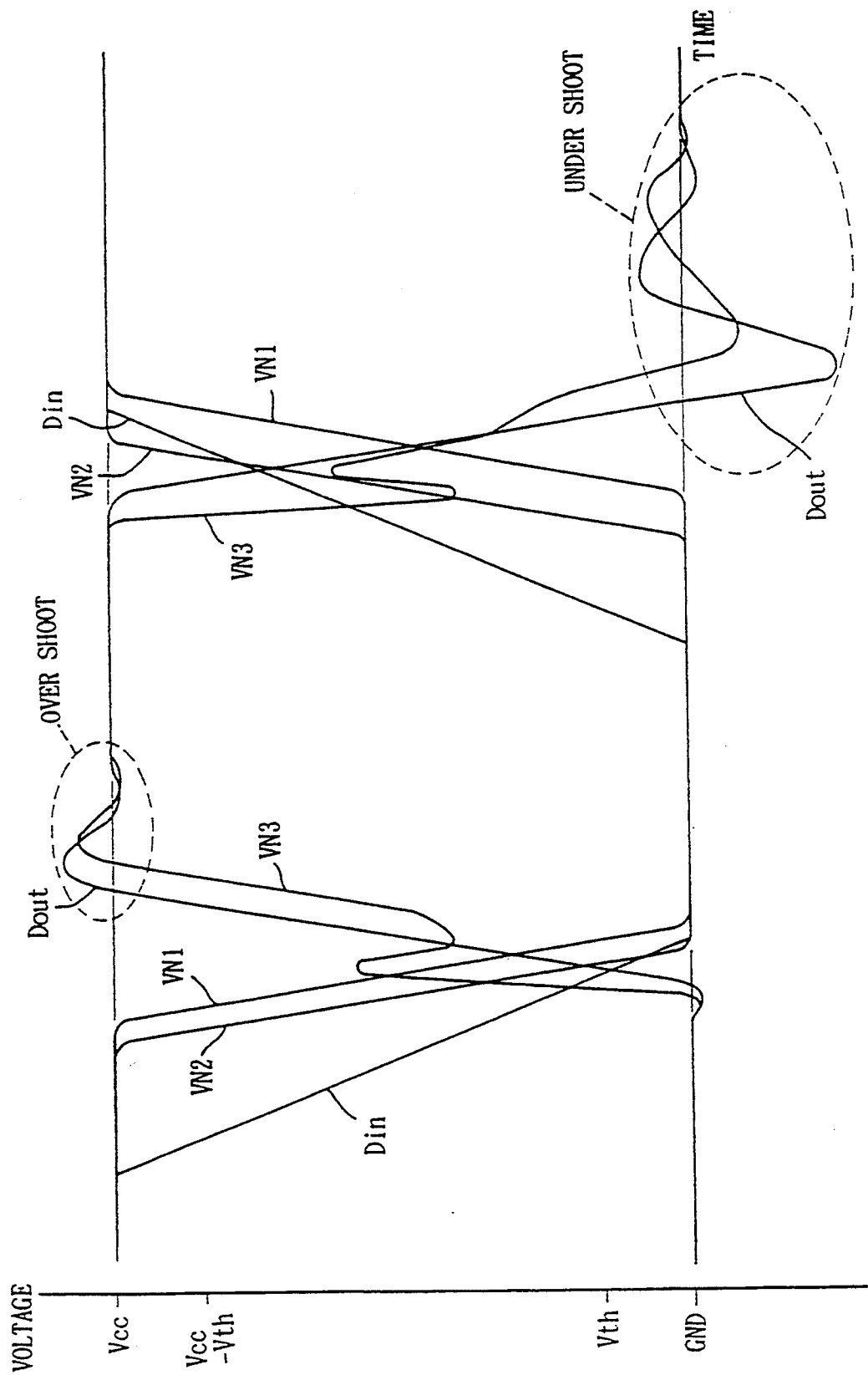
FIG. 16 is a diagram showing output waveforms of 1 cycle of respective circuits in the output buffer device of FIG. 14.

When output enable signal OE is at an H level and the logic level of input signal Din changes from an H level to an L level, the logic level of respective voltages VN1 and VN2 on respective nodes N1 and N2 changes from an H level to an L level in accordance with the change in the logic level of input signal Din. The operation up to this point is the same as that in the conventional example (FIG. 16), and the waveforms of voltages VN1 and VN2 are the same as those in the circuit of FIG. 14.

Voltage VN1 is applied to P channel transistors 1 and 1a, so that P channel transistors 1 and 1a turn on from an OFF state. Voltage VN2 is applied to N channel transistors 2 and 2a, so that N channel transistors 2 and 2a turn off from an ON state. When P channel transistor 1 turns on, voltage VN3 on node N3 increases to supply voltage Vcc. When P channel transistor 1a turns on, diode-connected P channel transistor 9 is connected through P channel transistor 1a to node N3 and voltage VN4 on node N4 falls once, so that P channel transistor 9 turns on.

If N channel transistor 2a turns off, the connection between nodes N3 and N5 is cut off, so that N channel transistor 10 is cut off.

While voltage VN3 on node N3 increases up to supply voltage Vcc as described above, if voltage VN4 on node N4 reaches Vcc-Vth, then N channel transistor 9 turns off. (Here, Vth is a threshold voltage of P channel transistor 9.) Accordingly, a path established from power supply terminal Vcc through P channel transistors 9 and 1a to node N3 is cut off. Thus, a current flowing from node N3 through bonding wire 3 to output terminal Dour decreases as voltage VN3 on node N3 becomes close to supply voltage Vcc, and the overshoot of an output signal is reduced.

A description will now be made on a case where the logic level of input signal Din changes from an L level to an H level.

If the logic level of input signal Din changes from an L level to an H level, then the logic level of both voltages VN1 and VN4 on nodes N1 and N2 changes from an L level to an H level like those in the conventional example. P channel transistors 1 and 1a turn off in response to voltage VN1. If P channel transistor 1a turns off, then P channel transistor 9 also turns off. N channel transistors 2 and 2a turn on in response to voltage VN2 of an H level. If N channel transistor 2a turns on, then nodes N5 and N3 are connected. Accordingly, voltage VN5 on node N5 increases once, so that N channel transistor 10 turns on. With N channel transistor 1 turning on, voltage VN3 on node N3 falls to the ground potential. N channel transistor 10, however, turns off when voltage VN5 on node N5 reaches the ground potential plus Vth. Accordingly, a current flowing through a path established from capacitive load to output terminal Dout and ground terminal GND becomes decreased as voltage VN3 becomes close to the ground potential, whereby an output undershoot is reduced as shown in FIG. 3.

Figure 4A:
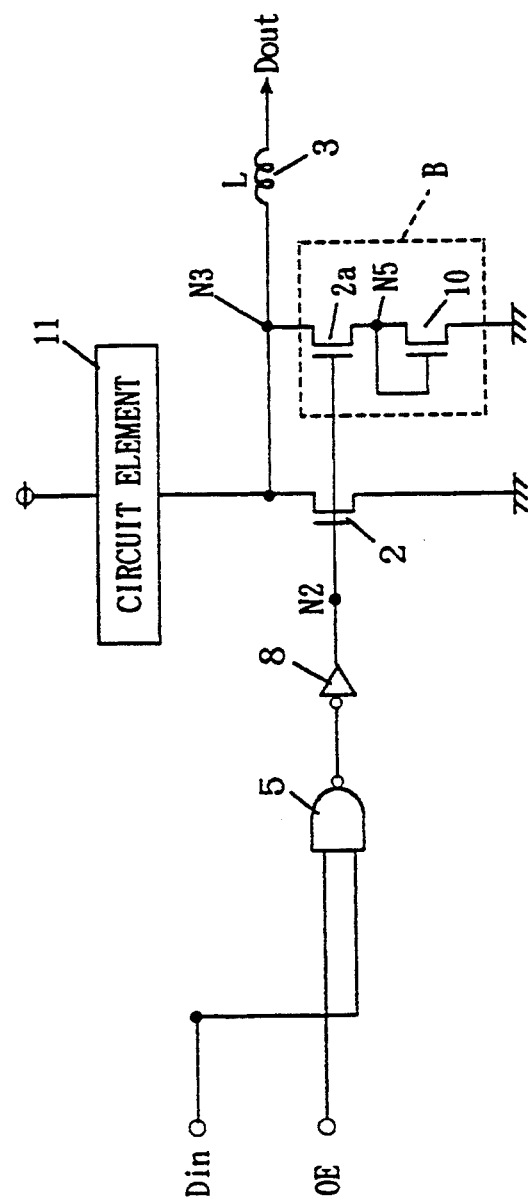
FIG. 4A is a circuit diagram showing structure of another embodiment of the present invention.

FIG. 4A shows another embodiment of the present invention. The buffer circuit shown in FIG. 4A differs from the output buffer circuit of FIG. 1 in that a circuit element 11 is provided instead of the high level output circuit. A resistance, a capacitor or a transistor may be used as the circuit element 11.

The output buffer circuit can reduced only the undershoot. Generally, amplitude of undershoot is larger than that of the overshoot, and the radio frequency noise can often be suppressed simply by reducing the undershoot.

Figure 4B:
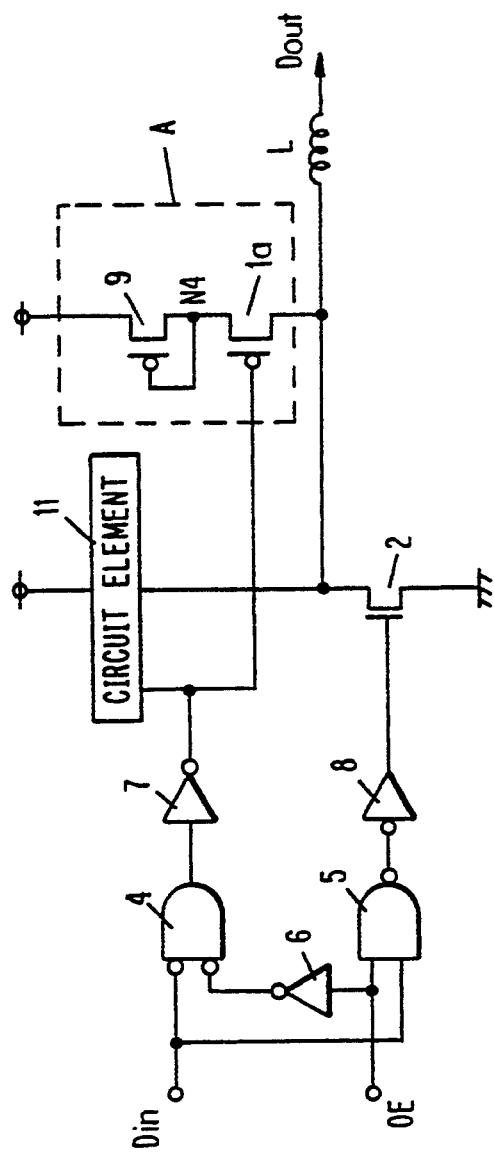
FIG. 4B is a circuit diagram showing structure of yet another embodiment of the present invention.

Alternately, the embodiment shown in FIG. 4B to reduce overshoot can be provided. The buffer circuit of FIG. 4B is a combination of the embodiments shown in FIGS. 1 and 4A.

Figure 5:
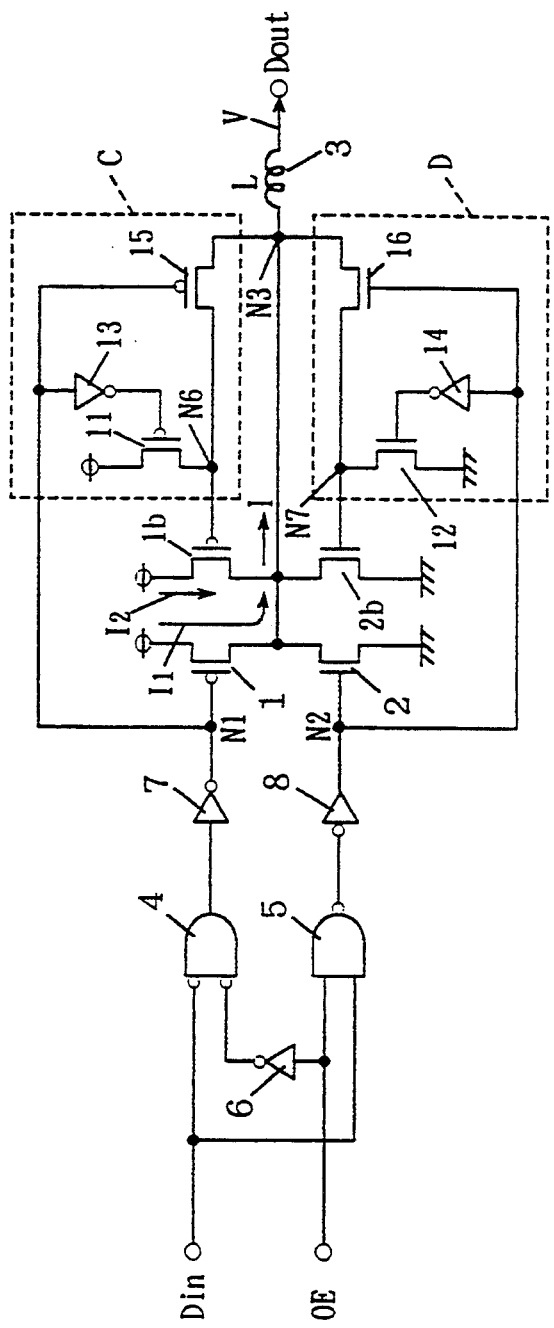
FIG. 5 is a circuit diagram showing structure of still another embodiment of the present invention.

FIG. 5 is a circuit diagram showing structure of another embodiment of an output buffer device according to the present invention.

The output buffer device shown in FIG. 5 includes a P channel transistor $1b$, an N channel transistor $2b$, a first level transmitting circuit C for transmitting the level of a node N3 to P channel transistor $1b$, and a second level transmitting circuit D for transmitting the level of node N3 to N channel transistor $2b$. The other circuits in the output buffer device are the same as those shown in FIG. 14.

P channel transistor $1b$ has its source electrode connected to a power supply terminal Vcc, its drain electrode to node N3 and its gate electrode to first level transmitting circuit C.

N channel transistor $2b$ has its source electrode connected to a ground terminal GND, its drain electrode to node N3 and its gate electrode to second level transmitting circuit D. First level transmitting circuit C includes a P channel transistor 11, an inverter 13 and a P channel transistor 15. P channel transistor 11 has its source electrode connected to power supply terminal Vcc, its drain electrode to a node N6 and its gate electrode to a node N1 via inverter 13. P channel transistor 15 has its source electrode connected to node N3, its drain electrode to node N6 and its gate electrode to node N1.

Second level transmitting circuit D includes an N channel transistor 12, an inverter 14 and an N channel transistor 16. N channel transistor 12 has its source electrode connected to ground terminal GND, its drain electrode to a node N7 and its gate electrode to a node N2 via inverter 14. N channel transistor 16 has its source electrode connected to node N3, its drain electrode to node N7 and its gate electrode to node N2.

The p channel transistor 11 and inverter 13 are provided to prevent node N6 from being in the floating state when the high level output circuit is off. Similarly, the n channel transistor 12 and inverter 14 are provided to prevent node N7 from being in the floating state when the low level output circuit is on.

An operation of the output buffer device shown in FIG. 5 will now be described with reference to the waveform diagram of FIG. 6.

Figure 6:
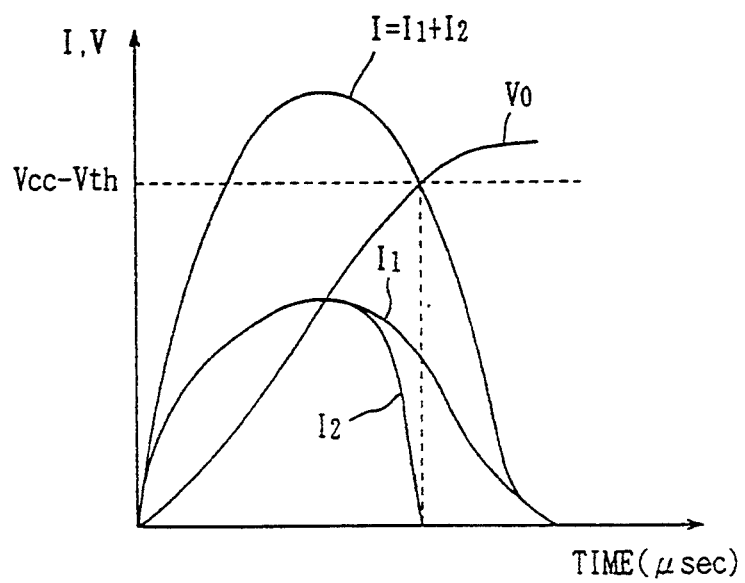
FIG. 6 is a diagram of output waveforms of various circuits at the time of generation of overshoot in the output buffer circuit shown in FIG. 5.

FIG. 6 is a diagram of waveforms of the voltage Vo at the output terminal Vout, the current I flowing through inductance L, the current $I_1$ flowing through p channel transistor 1 and the current $I_2$ flowing through p channel transistor $1b$ at the time of generation of the overshoot in the output buffer circuit shown in FIG. 5. Referring to FIG. 6, at the start of high level output, p channel transistors 1 and $1b$ are turned on, and the output current I becomes the sum of the currents $I_1$ and $I_2$. Accordingly, the speed of supplying charges to the load is increased. However, since p channel transistor $1b$ receives the voltage at node N3 through p channel transistor 15, it is equivalent to a diode connection, and it is turned off when the output voltage Vo attains Vcc-Vth. Therefore, the current $I_2$ is turned off earlier than current $I_1$, and the speed of change of the output current I can be reduced. This results in reduction of overshoot.

Figure 7:
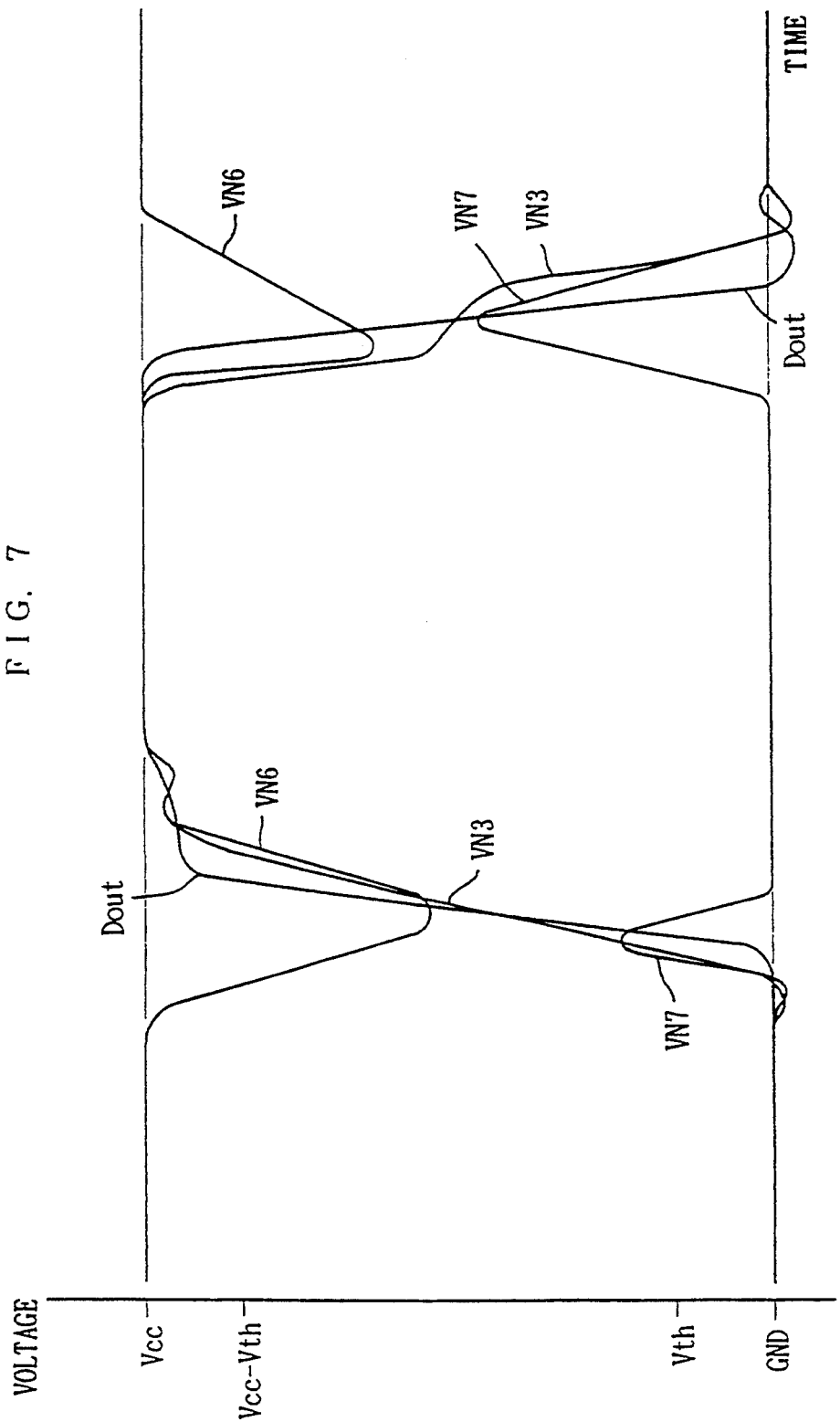
FIG. 7 is a signal waveform diagram of each circuit in the output buffer device of FIG. 5.

FIG. 7 is a waveform diagram of 1 cycle of voltages VN3 to VN7 on nodes N3 to N7 and output signal Dout. Since voltage waveforms of input signal Din and nodes N1 and N2 are identical to those shown in FIG. 3, a description thereof will not be repeated in FIG. 7 in order to simplify the description.

In operation, when the logic level of input signal Din changes from an H level to an L level, the level of voltages VN1 and VN2 on nodes N1 and N2 also changes from an H level to an L level. Voltage VN1 is applied to the gate electrode of P channel transistor 1, an input of inverter 13 and the gate electrode of P channel transistor 15, so that P channel transistors 1 and 15 turn on. Since P channel transistor 11 receives a signal inverted from voltage VN1, the transistor turns off. Voltage VN2 is applied to the gate electrode of N channel transistor 2, an input of inverter 14 and the gate electrode of N channel transistor 16, so that N channel transistors 2 and 16 turn off. Since N channel transistor 12 receives a signal inverted from voltage VN2 through inverter 14, the transistor turns on.

In such a manner, node N3 and the respective gate electrodes of P channel transistor $1b$ and N channel transistor $2b$ are connected, so that P channel transistor $1b$ turns on in response to voltage VN3 and N channel transistor $2b$ turns off. Accordingly, supply voltage Vcc is applied via P channel transistors 1 and $1b$ to node N3, and voltage VN3 on node N3 rises abruptly, so as to charge capacitive load connected to output terminal Dout.

P channel transistor $1b$, however, turns off from an ON state as voltage VN3 on node N3 becomes close to Vcc-Vth. Thus, a current flowing through node N3 becomes decreased as voltage VN3 becomes increased, thereby enabling a reduction in overshoot.

When the logic level of input signal Din changes from an L level to an H level, an undershoot is generated; however, this undershoot can be reduced as in the above case with the reduction in overshoot. That is, when the logic level of input signal Din changes from an L level to an H level, the level of voltages VN1 and VN2 on nodes N1 and N2 also changes from an L level to an H level. Voltage VN1 is, as aforementioned, applied to the gate electrode of P channel transistor 1, the input of inverter 13 and the gate electrode of P channel transistor 15, so that P channel transistors 1 and 15 turn off. Since P channel transistor 11 receives a signal inverted from voltage VN1, the transistor turns on. Voltage VN2, the level of which changes from an L level to an H level is applied to the gate electrode of N channel transistor 2, the input of inverter 14 and the gate electrode of N channel transistor 16, so that N channel transistors 2 and 16 turn on. Since N channel transistor 12 receives a signal inverted from voltage VN2 through inverter 14, transistor 12 turns off.

In such a manner, a path through which node N3 and the gate electrode of P channel transistor 1b are connected by first level transmitting circuit C, and a path through which node N3 and the gate electrode of N channel transistor 2b are connected by second level transmitting circuit D are formed. Accordingly, a ground potential GND is applied via N channel transistors 2 and 2b to node N3, voltage VN3 on node N3 rises abruptly, and a discharge current flows from load connected to output terminal Dout to ground terminal GND.

N channel transistor 2b, however, turns off as voltage VN3 on node N3 becomes close to GND+Vth. Thus, a current flowing through node N3 becomes decreased as voltage VN3 becomes decreased, thereby enabling a reduction in undershoot.

Figure 8:
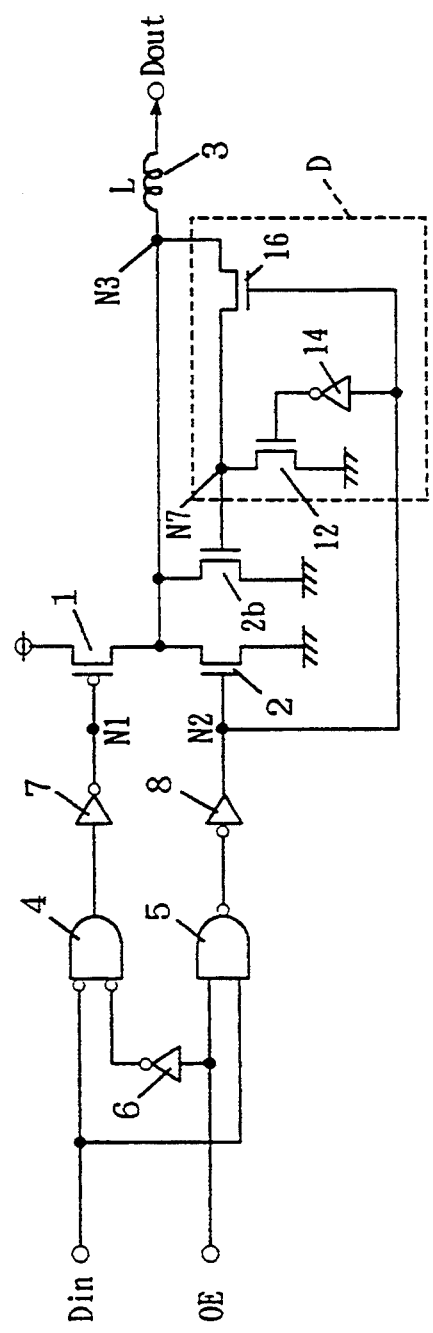
FIG. 8 is a circuit diagram showing a structure of still another embodiment of the present invention.

FIG. 8 is a schematic diagram showing a still further embodiment of the present invention. The output buffer circuit shown in FIG. 8 differs from the output buffer circuit of FIG. 5 in that p channel transistor 1b and the first level transmitting circuit C are omitted.

Similar to the output buffer circuit shown in FIG. 4, this output buffer circuit is capable of reducing only the undershoot. The circuit element shown in FIG. 4 may be used instead of the p channel transistor 1.

Figure 9:
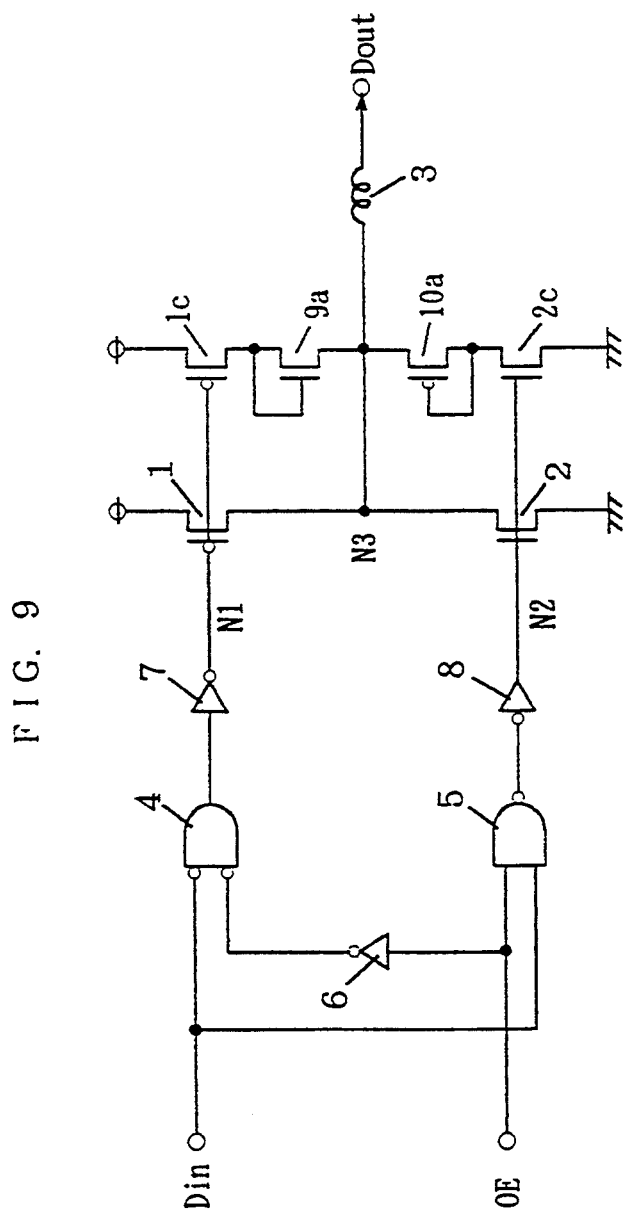
FIG. 9 is a circuit diagram showing a structure of still another embodiment of the present invention.

FIG. 9 is a circuit diagram showing structure of still another embodiment of the output buffer device of the present invention.

The output buffer device of FIG. 9 is different from that of FIG. 1 in that an N channel transistor 9a is provided in place of diode-connected P channel transistor 9 and that a P channel transistor 10a is provided in place of diode-connected N channel transistor 10.

Like P channel transistor 9, diode-connected N channel transistor 9a turns off when a voltage applied to its source electrode reaches Vcc-Vth. Like N channel transistor 10 of FIG. 1, P channel transistor 10a turns off when a voltage applied to its source electrode reaches GND+Vth. Thus, the output buffer device shown in FIG. 9 is able to increase output impedance in accordance with an increase or decrease of voltage VN3 on node N3, like the output buffer device shown in FIG. 1. Accordingly, an overshoot and undershoot can be reduced without a decrease in output speed of output signal Dout.

Figure 10:
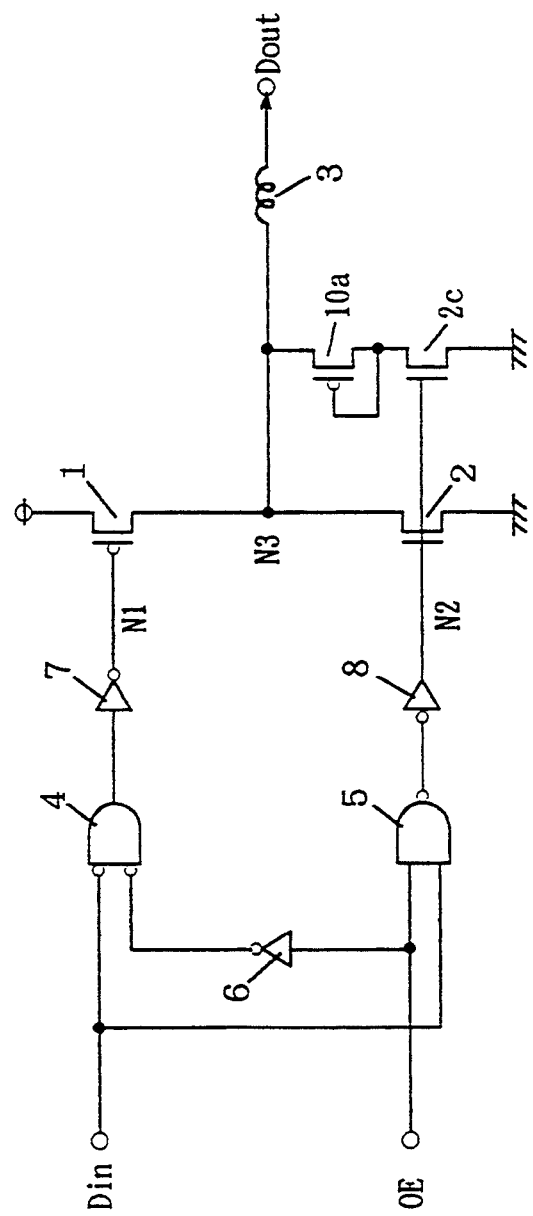
FIG. 10 is a circuit diagram showing a structure of still another embodiment of the present invention.

FIG. 10 is a schematic diagram showing a still further embodiment of the present invention. The output buffer circuit shown in FIG. 10 differs from the output buffer circuit of FIG. 9 in that p channel transistor 1c and an n channel transistor 9a are omitted. Similarly to the output buffer shown in FIG. 8, the output buffer circuit is capable of reducing only the undershoot. The circuit element shown in FIG. 4 may be used instead of the p channel transistor.

Figure 11:
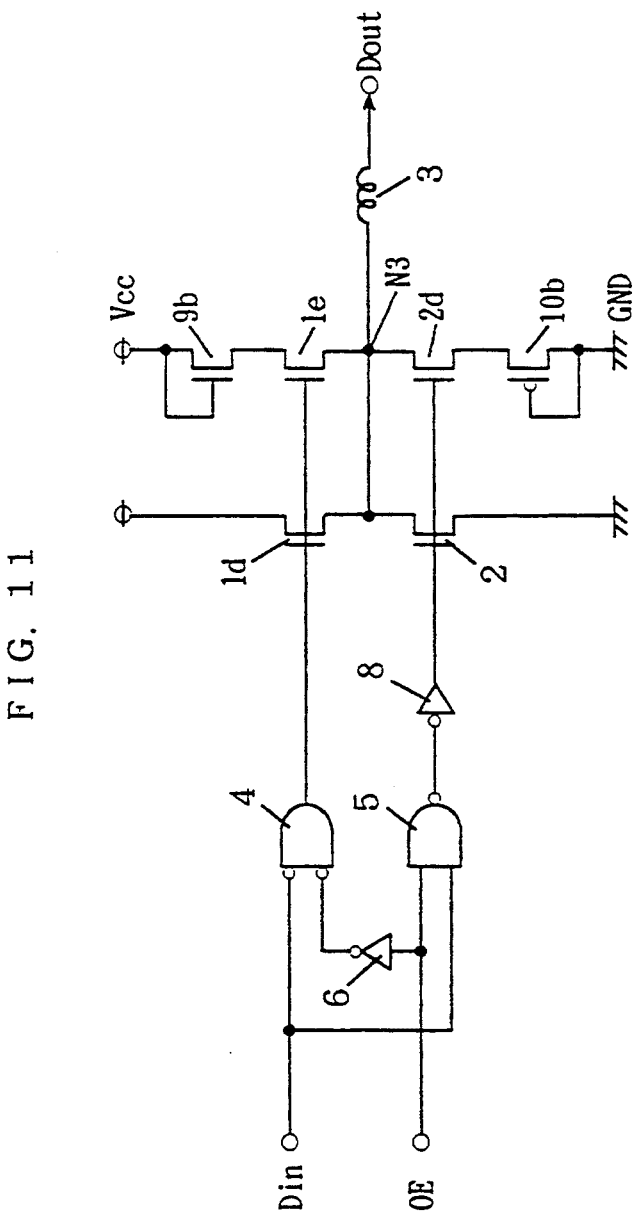
FIG. 11 is a circuit diagram showing a structure of still another embodiment of the present invention.

FIG. 11 is a circuit diagram showing still another embodiment of the output buffer device of the present invention.

The output buffer device of FIG. 11 is different from that of FIG. 1 in that inverter 7 is removed and that N channel transistors 1d, 1e and 9b are provided in place of P channel transistors 1, 1a and 9 on a pull-up side. Further, a P channel transistor 10b is provided in place of diode-connected N channel transistor 10.

In this output buffer device also, since N channel transistor 9b turns off when voltage VN3 on node N3 reaches Vcc-Vth and P channel transistor 10b turns off when voltage VN3 on node N3 reaches GND+Vth, output impedance can be increased in accordance with an increase or decrease in voltage on node N3. Accordingly, an overshoot and undershoot can be reduced without a decrease in output speed of output signal Dout.

Figure 12:
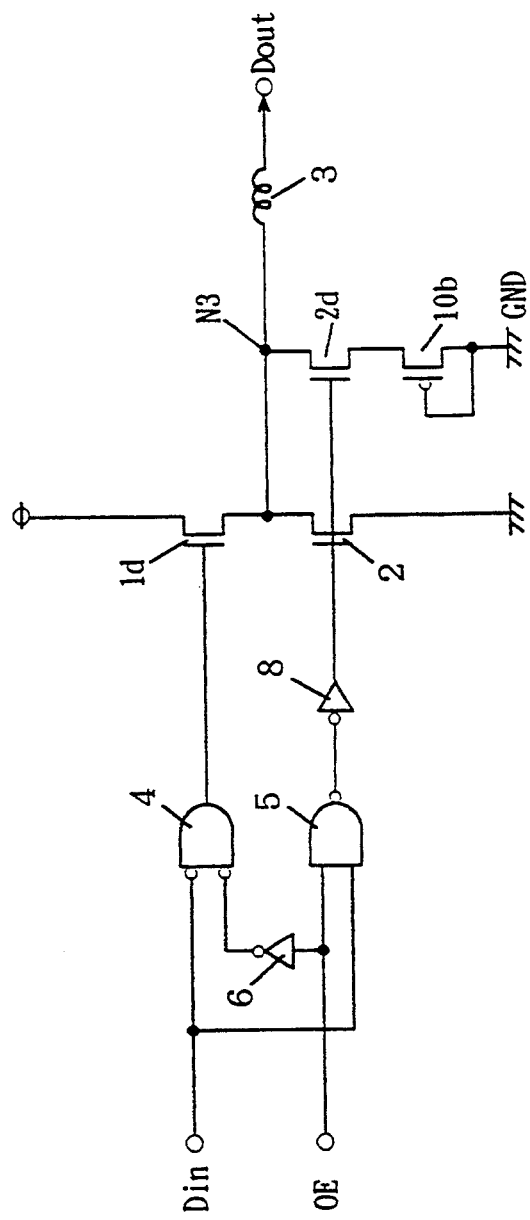
FIG. 12 is a circuit diagram showing a structure of still another embodiment of the present invention.

FIG. 12 is a schematic diagram showing still further embodiment of the present invention. The output buffer circuit shown in FIG. 12 differs from the output buffer circuit of FIG. 11 in that the n channel transistors 9b and 1e of the high level output circuit are omitted.

This output buffer circuit reduces undershoot only.

The circuit element shown in FIG. 4 may be used instead of the n channel transistor 1d.

Figure 13:
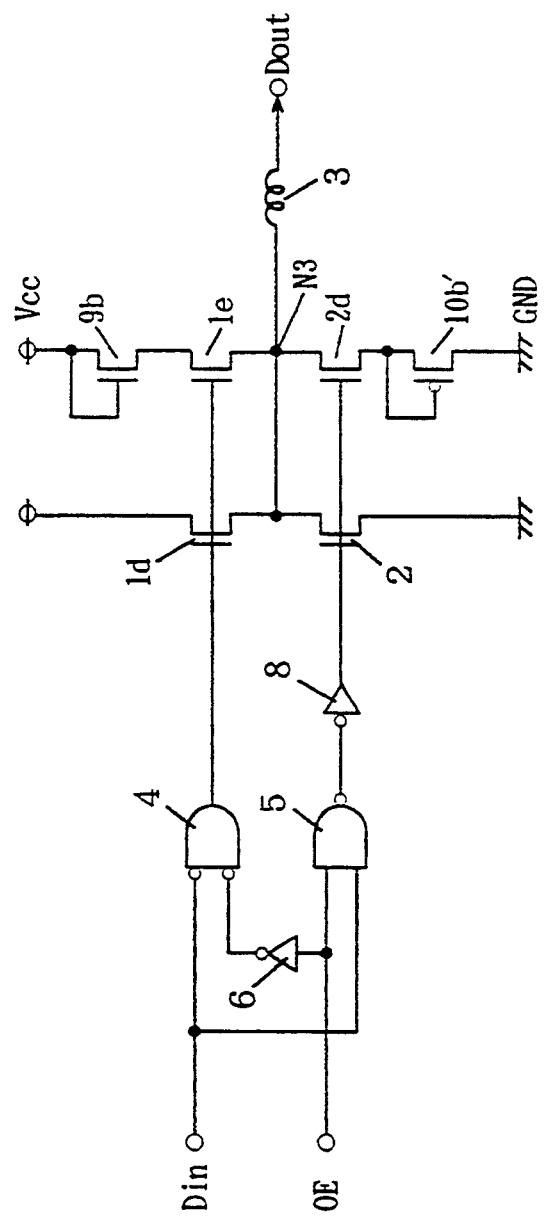
FIG. 13 is a circuit diagram showing a structure of still another embodiment of the present invention.

FIG. 13 is a schematic diagram showing still further embodiment of the present invention. The output buffer circuit shown in FIG. 13 differs from that of FIG. 11 in that a n channel transistor 10b' is provided instead of the p channel transistor 10b. By doing so, all transistors can be made n type.

While MOS transistors are employed in all the embodiments shown in FIGS. 1-13, the same effect can be obtained also by employing bipolar transistors in place of such MOS transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer device, comprising:
   an output terminal for outputting data;
   an input terminal for receiving a binary logic signal;
   first and second power supply terminals set respectively at high and low potentials;
   a first switching element connected between said output terminal and said first power supply terminal;
   a second switching element connected between said output terminal and said second power supply terminal;
   switching control means for turning on and off said first and second switching elements in a complementary manner in response to said binary logic signal; and
   compensating means for increasing output impedance to said output terminal in response to the voltage at said output terminal approaching a voltage level corresponding to the data to be output upon a change in level of said binary logic signal whereby excessive shooting effects of inherent inductance at said output terminal are mitigated.

2. An output buffer circuit in accordance with claim 1, wherein
   said compensating means comprises
   i) switching means coupled in parallel with at least one of said first and second switching elements, and
   ii) compensation control means responsive to the voltage at said output terminal for temporarily increasing impedance of said switch means upon a change in level of said binary logic signal.

3. An output buffer circuit in accordance with claim 2, wherein said compensation control means comprises means responsive to the voltage at said output terminal for turning off said switch means before the voltage at the output node reaches a predetermined level.

4. An output buffer circuit, comprising:
an output terminal for outputting data;
a first power supply terminal set at a driving potential;
a second power supply terminal set at a ground potential;
a first switching element connected between said output terminal and said first power supply terminal;
a second switching element connected between said output terminal and said second power supply terminal;
switching control means for turning on and off said first and second switching elements in a complementary manner in response to and input signal representing data; and
output impedance increasing means connected between said output terminal and said first power supply terminal and between said output terminal and said second power supply for increasing output impedance to said output terminal in response to the voltage at said output terminal approaching a voltage level corresponding to the data to be output upon a change in level of said input signal whereby excessive shooting effects of inherent inductance at said output terminal are mitigated.

5. The output buffer circuit according to claim 4, wherein
said output impedance increasing means includes third and fourth switching elements connected in series between at least one of
 i) said output terminal and said first power supply terminal, and
 ii) said output terminal and said second power supply terminal,
said third switching element turning on and off together with said first switching element in response to an input signal when said third and fourth switching elements are connected in series between said output terminal and said first power supply terminal, and turning on and off together with said second switching element in response to an input signal when said third and fourth switching elements are connected in series between said output terminal and said second power supply terminal, said fourth switching element turning off in response to a voltage of said output terminal.

6. The output buffer device according to claim 5, wherein
each of said first, third and fourth switching elements includes a MOS transistor having a common conductivity type when said third and fourth switching elements are connected in series between said output terminal and said first power supply terminal, said MOS transistor employed in said fourth switching element being diode-connected.

7. The output buffer device according to claim 5, wherein
said third and fourth switching elements include a MOS transistor of different conductivity types when said third and fourth switching elements are connected in series between said output terminal and said second power supply terminal, said MOS transistor employed in said fourth switching element being diode-connected.

8. An output buffer circuit, comprising:
an output terminal for outputting data;
a first power supply terminal set at a driving potential;
a second power supply terminal set at a ground potential;
a first switching element connected between said output terminal and said first power supply terminal;
a second switching element connected between said output terminal and said second power supply terminal;
switching control means for turning on and off said first and second switching elements in a complementary manner in response to and input signal representing data;
switching means connected between said output terminal and one of said first and second power supply terminals; and
output voltage applying means responsive to said input signal for applying an output voltage at said output terminal to a control terminal of said switching means for increasing output impedance to said output terminal in response to the voltage at said output terminal approaching a voltage level corresponding to the data to be output upon a change in level of said input signal whereby excessive shooting effects of inherent inductance at said output terminal are mitigated.

9. The output buffer circuit according to claim 8, wherein
said output voltage applying means includes
third switching means responsive to said input signal for switching on or off between said output terminal and said control terminal; and
fourth switching means responsive to said input signal for switching on or off between either said first or second power supply terminal and said control terminal.

10. A semiconductor integrated device having an output buffer circuit, said output buffer circuit comprising:
 (i) a circuit element connected between a supply potential node and an output node connected to an output bonding pad, and
 (ii) an n-type MOS transistor connected between a ground potential node and said output node, a gate electrode of said n-type MOS transistor connected to a binary signal input node for conduction in response to a high level input at said node, and
a current bypass means, connected between said output node and said ground potential node, and conductive in response to a high level input at said input node, said current bypass means rendered non-conductive earlier than said n-type MOS transistor while said input signal remains at said high level for increasing output impedance to said output node in response to voltage at said output node approaching a voltage level corresponding to data to be output upon a change in level at said binary signal input node to said high level input whereby excessive shooting effects of inherent inductance at said output node are mitigated.

11. A semiconductor integrated device having an output buffer circuit, said output buffer circuit comprising:

(i) a circuit element connected between a supply potential node and an output node connected to an output bonding pad, and (ii) an n-type MOS transistor connected between a ground potential node and said output node, a gate electrode of said n-type MOS transistor connected to a binary signal input terminal for conduction in response to a high level input at said terminal, and a current bypass means, connected between said output node and said supply potential node, and conductive in response to a low level input at said input terminal, said current bypass means rendered non-conductive earlier than said n-type MOS transistor while said input signal remains at said low level for increasing output impedance to said output node in response to voltage at said output node approaching a voltage level corresponding to data to be output upon a change in level at said binary signal input terminal to said low level input whereby excessive shooting effects of inherent inductance at said output node are mitigated.

12. A semiconductor integrated device having an output buffer circuit, said output buffer circuit comprising:

(i) a p-type MOS transistor responsive to an input signal at an input terminal and connected between a supply potential node and an output node connected to an output bonding pad and (ii) an n-type MOS transistor responsive to said input signal and connected between a ground potential node and said output node a first current bypass means, responsive to said input signal and connected between said output node and said ground potential node, and conductive in response to a high level input at said input terminal, said current bypass means rendered non-conductive earlier than said n-type MOS transistor while said input signal remains at said high level for increasing output impedance to said output node in response to voltage at said output node approaching a voltage level corresponding to data to be output upon a change in level at said input terminal to said high level input whereby excessive undershooting effects of inherent inductance at said output node are mitigated, and a second current bypass means, connected between said output node and said supply potential node, and conductive in response to a low level input at said input terminal, said current bypass means rendered non-conductive earlier than said p-type MOS transistor while said input signal remains at said low level for increasing output impedance to said output node in response to voltage at said output node approaching a voltage level corresponding to data to be output upon a change in level at said input terminal to said low level input whereby excessive overshooting effects of inherent inductance at said output node are mitigated.

13. A semiconductor integrated device having an output buffer circuit, said output buffer circuit comprising:

(i) a circuit element connected between a supply potential node and an output node connected to an output bonding pad, and (ii) an n-type MOS transistor connected between a ground potential node and said output node, a gate electrode of said n-type MOS transistor connected to a binary signal input terminal for conduction in response to a high level input at said binary signal input terminal, and a current bypass means including (i) a second n-type MOS transistor responsive to said input signal and connected between said output node and a connection node, and (ii) a potential dropping means connected between said connection node and said ground potential node for raising the potential of said connection node with respect to said ground potential node to increase output impedance to said output node in response to voltage at said output node approaching a voltage level corresponding to data to be output upon a change in level at said binary signal input terminal to said high level input whereby excessive undershooting effects of inherent inductance at output node are mitigated.

14. A semiconductor integrated device having an output buffer circuit, said output buffer circuit comprising:

(i) a circuit element connected between a supply potential node and an output node connected to an output bonding pad and (ii) an n-type MOS transistor responsive to said input signal and connected between a ground potential node and said output node, a current bypass means including (i) a p-type MOS transistor responsive to said input signal and connected between said output node and a connection node, and (ii) a potential dropping means connected between said supply potential node and said connection node for dropping the potential at said connection node with respect to said supply potential node.

15. A semiconductor integrated device having an output buffer circuit, said output buffer circuit comprising:

(i) a p-type MOS transistor responsive to an input signal at an input terminal and connected between a supply potential node and an output node connected to an output bonding pad and (ii) an n-type MOS transistor responsive to said input signal and connected between a ground potential node and said output node a current bypass means including (i) a second p-type MOS transistor responsive to said input signal and connected between said output node and a first connection node, (ii) a first potential dropping means connected between said supply potential node and said connection node for dropping the potential at said first connection node with respect to said supply potential node, (iii) a second n-type MOS transistor responsive to said input signal and connected between said output node and a second connection node, and (iv) a second potential dropping means connected between said second connection node and ground potential node for raising the potential of said second connection node with respect said ground potential node.

16. A method for compensating for effects of inherent inductance in bonding wire of a semiconductor integrated circuit including an output buffer having an output terminal for generating an output signal, an input terminal for receiving a logic level signal, a first switching element connected between the output terminal and a first power supply terminal, and a second switching element connected between the output terminal and a second power supply terminal, said method comprising the steps of:

connecting said output terminal to said first power supply terminal through said first switching element when a first logic level signal is applied to said input terminal;

connecting said output terminal to said second power supply terminal through said second switching element when a second logic level signal is applied to said input terminal; and increasing impedance in series with said output terminal in response to voltage at the output terminal approaching a voltage level corresponding to data to be output upon a change in level of the binary logic signal applied to said input terminal thereby dampening overshoot or undershoot of the output terminal.

17. The output buffer device according to claim 5, wherein each of said second, third and fourth switching elements includes a MOS transistor having a common conductivity type when said third and fourth switching elements are connected in series between said output terminal and said second power supply terminal, said MOS transistor employed in said fourth switching element being diode-connected.

* * * * *